United States Patent
Thompson

(10) Patent No.: US 9,515,602 B2
(45) Date of Patent: Dec. 6, 2016

(54) SOLAR ARRAY CONDITION MONITORING THROUGH CONTROLLED INVERTER VOLTAGE SWEEPING

(71) Applicant: Eaton Corporation, Cleveland, OH (US)

(72) Inventor: Christopher Scott Thompson, Kingston, RI (US)

(73) Assignee: Eaton Corporation, Cleveland, OH (US)

( * ) Notice: Subject to any disclaimer, the term of this patent is extended or adjusted under 35 U.S.C. 154(b) by 258 days.

(21) Appl. No.: 14/092,172

(22) Filed: Nov. 27, 2013

(65) Prior Publication Data

US 2015/0145550 A1    May 28, 2015

(51) Int. Cl.
*H02S 50/10* (2014.01)
*G01R 31/26* (2014.01)
*H01L 31/04* (2014.01)
*H01L 51/00* (2006.01)

(52) U.S. Cl.
CPC ............... *H02S 50/10* (2014.12); *G01R 31/26* (2013.01); *H01L 31/04* (2013.01); *H01L 51/0031* (2013.01)

(58) Field of Classification Search
CPC .......... H02S 50/10; G01R 31/26; H01L 31/04; H01L 51/0031
USPC .................................................... 324/761.01
See application file for complete search history.

(56) References Cited

U.S. PATENT DOCUMENTS

| | | | | |
|---|---|---|---|---|
| 4,467,438 A | * | 8/1984 | Zerlaut | G01R 31/2635 136/290 |
| 2006/0085167 A1 | * | 4/2006 | Warfield | H02S 50/10 702/188 |
| 2008/0272279 A1 | * | 11/2008 | Thompson | H01L 31/02021 250/206 |
| 2011/0204900 A1 | * | 8/2011 | Beck | H02S 50/10 324/537 |
| 2012/0065936 A1 | * | 3/2012 | Singamsetti | H02S 50/10 702/183 |
| 2012/0223733 A1 | * | 9/2012 | Gunawan | F21S 8/006 324/761.01 |
| 2012/0242320 A1 | * | 9/2012 | Fischer | H02S 50/10 324/72 |

* cited by examiner

*Primary Examiner* — Arleen M Vazquez
*Assistant Examiner* — Robert P Alejnikov, Jr.
(74) *Attorney, Agent, or Firm* — Ziolkowski Patent Solutions Group, SC

(57) ABSTRACT

A PV system includes an irradiance meter to measure solar irradiance received by a PV array in the system. A PV inverter is electrically connected to the PV array via a DC link to regulate the voltage of the PV array. A controller receives an input from the irradiance meter regarding the solar irradiance received by the PV array, causes the PV inverter to alter the operating voltage of the PV array to each of a plurality of voltage values, detects current values in the PV array responsive to the altering of the voltage to each of the voltage values, and generates a power performance curve for the PV array based on the voltage values at which the PV array is operated and the detected current values, with the power performance curve being generated at a known level of solar irradiance based on the input from the irradiance meter.

16 Claims, 3 Drawing Sheets

SOLAR ARRAY CONDITION MONITORING THROUGH CONTROLLED INVERTER VOLTAGE SWEEPING

BACKGROUND OF THE INVENTION

Embodiments of the present invention relate generally to photovoltaic (PV) arrays and, more particularly, to systems and methods for collecting performance data on PV arrays for condition monitoring thereof, so as to enable accurate detection of PV array degradation or other performance related issues.

PV power systems are power systems that employ a plurality of solar modules to convert sunlight into electricity. PV systems include multiple components, including photovoltaic modules, mechanical and electrical connections and mountings, and means of regulating or modifying the electrical output. One common arrangement in PV systems is for several PV modules to be connected in series to form a PV string, with multiple PV strings in a PV system then being combined in parallel to aggregate the current in a PV array. The PV modules generate direct current (DC), with the level of DC current being primarily dependent on solar irradiation and the number of solar modules used. The level of DC voltage is primarily dependent on the arrangement of the PV modules and operating temperature. When alternating current (AC) power is desired, an inverter is used to convert the DC energy from the array into AC energy, with such AC energy being suitable for transfer to a power grid.

It is recognized that there are several system design and component challenges associated with the operation of PV power systems, including system monitoring and understanding of system performance. Furthermore, it is recognized that PV arrays degrade over time and lose power and that PV arrays can also have failures either in the module itself or in the wiring and connections in between modules. With respect to system monitoring, such monitoring in existing PV power systems is often performed by monitoring hardware and software in the inverter that collects and analyzes data during operation of the PV modules in existing natural operating conditions. For example, current measurements can be acquired via current sensors either in the inverter or separate to the inverter. These values can be sampled periodically (e.g., sampling rate of 15 minutes) and sent to a central service for analyzing by an algorithm, with the algorithm identifying degraded strings or degraded groups of strings (depending on current sensor locations) by data-mining current measurement with values lower than the average/typical current.

While this collected data can provide useful points of data for identifying degradation of the PV arrays and/or failures in the PV arrays or wiring/connections of the PV system, it does not provide accurate performance curves that would enable a detailed diagnosis of the PV system condition. Additionally, the data collected via traditional means by existing monitoring systems is not calibrated or collected under defined conditions. This results in performance data this is not sufficiently accurate or useful to understand PV plant performance.

It would therefore be desirable to provide a solution for a PV system that controls the data collection such that calibrated conditions are applied. It would also be desirable for the monitoring solution to force the voltage conditions to specifically develop full operating curves rather than discrete operating points.

BRIEF DESCRIPTION OF THE INVENTION

Embodiments of the present invention provide a system and method for collecting performance data on PV arrays for condition monitoring thereof, so as to enable accurate detection of PV array degradation or other performance related issues.

In accordance with one aspect of the invention, a PV system includes a PV array comprising a plurality of PV strings configured to generate a string output power responsive to received solar irradiation, a DC link connected to the plurality of PV strings such that the plurality of PV strings are connected to the DC link in a parallel arrangement, and a PV inverter electrically connected to the DC link to receive a DC output therefrom, the PV inverter configured to regulate the voltage of the plurality of PV strings. The PV system also includes an irradiance meter configured to measure a level of solar irradiance received by the PV array and a controller to control operation of the PV inverter for performing a diagnostic testing of the PV array, the controller being programmed to receive an input from the irradiance meter, the input comprising the measured level of solar irradiance received by the PV array, cause the PV inverter to alter the operating voltage of the PV array to each of a plurality of voltage values, detect current values in the PV array responsive to the altering of the voltage to each of the plurality of voltage values, and generate a power performance curve for the PV array based on the plurality of voltage values at which the PV array is operated and the detected current values, with the power performance curve being generated for the PV array at a known level of solar irradiance based on the received input from the irradiance meter.

In accordance with another aspect of the invention, a method for performing diagnostic testing on a PV array includes operating each of a plurality of parallel arranged PV strings in a PV array at a DC bus voltage determined by a PV inverter that is coupled to the plurality of PV strings by way of a DC bus, measuring a level of solar irradiance received by the plurality of PV strings, and selectively causing the PV inverter to alter an operating voltage of each of the plurality of PV strings to each of a plurality of voltage values, the plurality of voltage values spanning a entire DC operating voltage range of the PV strings. The method also includes detecting a current value in each of the plurality of PV strings for each of the respective plurality of voltage values to which the PV strings are altered and generating a power performance curve for each of the plurality of PV strings based on the plurality of voltage values at which the PV strings are operated and the respective detected current values, wherein the power performance curve generated for each of the plurality of PV strings is generated at a defined level of solar irradiance as known by the measured level of solar irradiance.

In accordance with yet another aspect of the invention, a PV system includes a PV inverter, a DC link electrically coupled to the PV inverter and operating at a DC link voltage as determined by the PV inverter, and a PV array connected to the DC link and comprising a plurality of PM modules, the PV array configured to generate an output power responsive to received solar irradiation. The PV system also includes one or more irradiance meters connected to the PV array to measure a level of solar irradiance received thereby and a controller to control operation of the PV inverter for selectively performing a diagnostic testing of the PV array at each of a plurality of pre-determined irradiance conditions, the controller configured to selectively cause the PV inverter to sweep the DC operating voltage range of the PV array at each of one or more defined irradiance conditions, collect current data generated from the PV array responsive to the sweeping of the DC operating voltage range, and generate a power-voltage curve for the PV array at each of one or more defined irradiance conditions responsive to the sweeping of the DC operating voltage range of the PV array and the collected current data.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENTS

Embodiments of the invention set forth herein relate to a system and method for active monitoring of a PV array in a PV power system. A PV system is provided that includes a PV inverter that operates to perform a diagnostic test that sweeps the DC operating voltage of the PV array under defined irradiance conditions so as to enable condition monitoring of PV strings in the PV system and identify degradation of PV modules therein.

Figure 1:
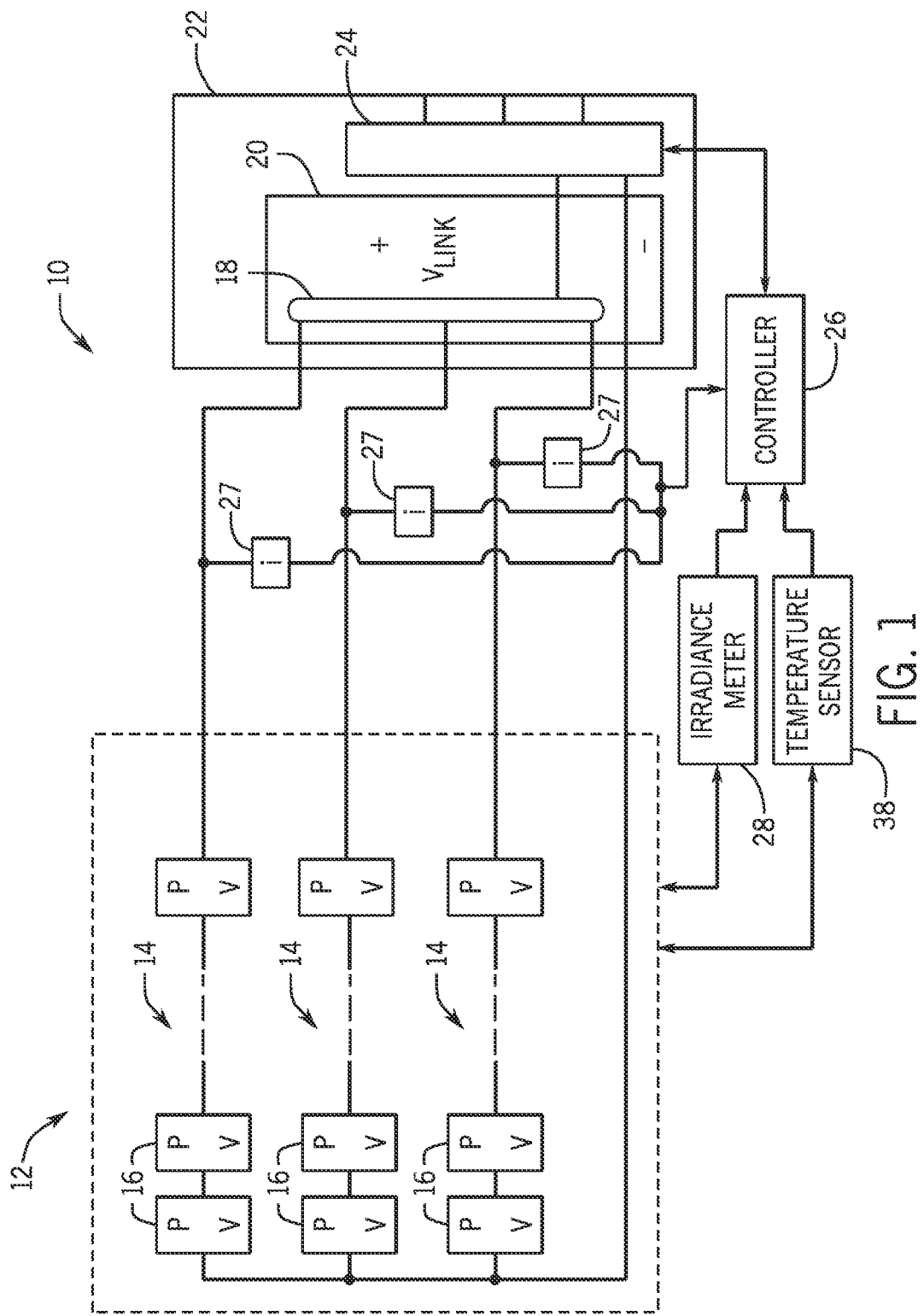
FIG. 1 is a schematic diagram of a PV system according to an embodiment of the invention.

Referring now to FIG. 1, a PV system 10 is illustrated according to an embodiment of the invention. The PV system 10 includes one or more PV arrays 12 each having a plurality of PV strings 14, with each PV string 14 in turn being comprised of a plurality of PV modules 16 that are connected in series. The PV modules 16 function to generate direct current (DC) power, with the level of DC current being dependent on solar irradiation as well as the number and configuration of the PV panels used. The level of DC voltage is dependent on temperature as well as the number and configuration of the PV panels used. While only a first PV array 12 is shown in FIG. 1, it is recognized that the number of PV arrays 12 in PV power system 10 can vary, with two, three, four or more PV arrays 12 being included in the PV power system 10, for example. Similarly, while only three PV strings 14 are shown as being included in PV array 12, with each string including only three PV modules 16, it is recognized that the number of PV strings in PV array 12 can vary, with two, three, four or more PV strings being included in the PV array 12, and that the number of PV modules 16 in series in each string can also vary substantially, with a much greater number of modules being included in a string 12.

As shown in FIG. 1, the PV strings 14 of PV array 12 are electrically connected in parallel to a DC link or bus 18 that, according to one embodiment, is housed in a combiner box 20. The combiner box 20 aggregates the DC power from the PV strings 14 and provides a parallel connection point (i.e., a common DC bus 18) for the PV strings 14, with the combiner box 20 also often providing overcurrent protection and isolation means. Also included in PV system 10 is a PV inverter 22 that is electrically connected to the output of combiner box 20. The PV inverter 22 operates to perform the conversion of the variable DC output of the PV modules 16 of PV strings 14 into a fixed frequency AC current (i.e., a DC-to-AC conversion) for use by an AC load, such as a power grid (not shown) for example. To perform this conversion, the PV inverter 22 includes a plurality of switches, generally indicated by 24, that function to selectively regulate the effective DC operating voltage of PV array 12 and convert it to AC power for use by the load (not shown).

According to one embodiment of the invention, the PV inverter 22 is configured to perform a system level (or "global") maximum power point tracking (MPPT) in PV system 10 according to an array power algorithm implemented thereby. More specifically, a controller 26 is operably coupled to, or embedded within, PV inverter 22 to perform the MPPT, with the controller 26 being programmed to selectively control switching of inverter switches 24. According to embodiments of the invention, controller 26 may be in the form of a separate dedicated controller or may form part of an existing inverter controller that controls functions of PV inverter 22 along with the controlling of switches 24. In performing the global MPPT, PV inverter 22 functions to get the maximum possible power from the PV system 10 by dynamic loading of the PV array 12 to obtain maximum power for any given environmental conditions. The PV inverter 22 functions to control the voltage on the DC link 18 according to the MPPT instituted by the array power algorithm, based on the maximum power able to be output from the PV power system 10, and essentially defines the current that the inverter 22 should draw from the PV strings 14 in order to get the maximum possible power (since power equals voltage times current) for the PV system 10.

According to embodiments of the invention, PV inverter 22 is further configured to selectively vary and regulate voltages in PV array 12 in order to perform diagnostic testing and condition monitoring of the PV strings 14. More specifically, the controller 26 is programmed to cause inverter 22 to alter the operating voltage on PV strings 14—such as by causing the inverter 22 to alter the DC link voltage to which the PV strings 14 are connected— in order to monitor a condition of PV modules 16 in the PV strings 14, so as to identify degradation of the PV modules 16 and detect failures in the PV modules and/or in the wiring and connections between the PV modules. In operation, the PV inverter 22 is operated by controller 26 to regulate and alter the voltage on PV strings 14, such that the PV strings 14 are caused to operate at each of a plurality of distinct test voltage values—thereby performing a "voltage sweep" of the DC operating voltage range of the PV array 12.

In regulating the voltage of PV strings 14 to each of a plurality of test voltages by way of inverter 22 (via controller 26), the currents of the PV strings 14 will also be changed/varied responsive to the change in voltage. The controller 26 is configured to detect such changes in current—such as via measurements by current sensors 27 that are provided to controller 26—and, with several samples of pairs of voltage and current, the controller 26 is able to determine a relationship between the current and voltage for the respective PV strings 14—such that power-voltage curves for a PV string 14 can be generated, as will be explained in greater detail below.

In regulating and altering the voltage on PV strings 14 in order to perform the diagnostic testing and condition monitoring of the PV array 12, it is recognized that it is highly desirable that the voltage sweep of the DC operating voltage range of the PV array 12 that is implemented by PV inverter 22 be performed under defined conditions. That is, while performing the voltage sweep of the DC operating voltage range of the PV array 12 provides for collection of large amounts of discrete operating data points (i.e., current and voltage data points), it is recognized that the acquisition of such data points under random/undefined conditions would make it difficult to understand the data in a useful way. The acquisition of such data points under random/undefined conditions therefore inhibits the diagnosis of potential operating issues in the PV array 12. As such, according to embodiments of the invention, the voltage sweep of the DC operating voltage range of the PV array 12 implemented by inverter 22 and controller 26 is performed under defined irradiance conditions such that data points are acquired under defined conditions, such that the acquired data is standardized.

To enable the acquisition of voltage and current data under defined irradiance conditions, one or more irradiance meters 28 are included in PV system 10 that measure the level of solar irradiance in the environment in which the PV array 12 is operating. A single irradiance meter 28 can be provided for the entire PV array 12, as shown in FIG. 1, or alternatively an irradiance meter 28 can be provided for each PV string 14 or PV module 16, according to embodiments of the invention. The irradiance meter 28 is in operable communication with the controller 26 such that it provides data on current solar conditions to the controller 26, with the PV inverter 22 thus working in conjunction with the irradiance meter 28 to perform diagnostic testing of the PV array 12.

Figure 2:
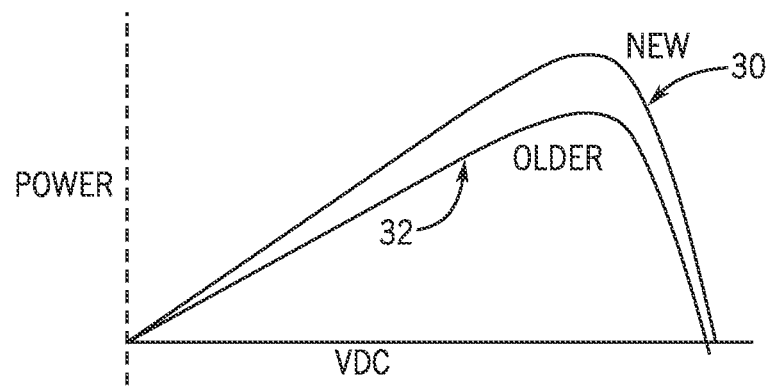
FIG. 2 is a graph illustrating power versus voltage curves for a healthy PV string and one example of an underperforming PV string.
Figure 3:
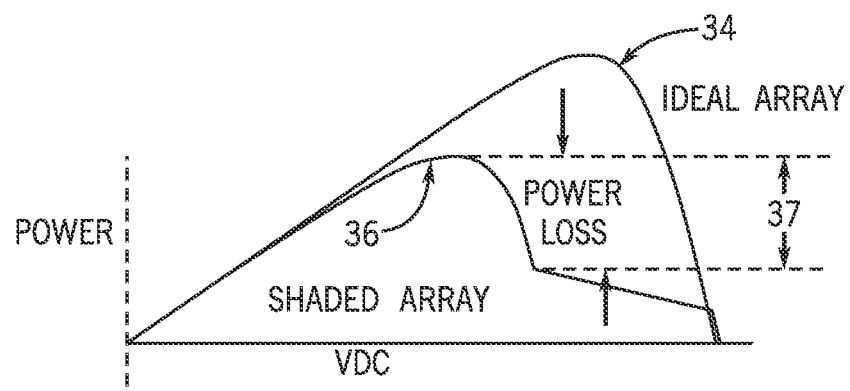
FIG. 3 is a graph illustrating power versus voltage curves for an ideal PV string and a shaded PV string.

In operation, when the irradiance meter 28 detects solar conditions that are favorable for performing diagnostic testing of the PV array 12 and the controller 26 receives such irradiance readings from the meter 28 and recognizes that diagnostic can be performed, the controller 26 will cause the PV inverter 22 to perform a diagnostic test that sweeps the DC operating voltage of the PV array 12 under the known/defined irradiance conditions. Performing of the diagnostic test under defined conditions generates a power-voltage curve (i.e., power output performance curve)—with power on the Y axis and DC voltage on the x-axis—for a known solar irradiance level. The nature of the current-voltage relationship on a PV string 14 can be illustrated in a power-voltage curve, as shown in the examples provided in FIGS. 2 and 3. Such power-voltage curves have known shapes that can help diagnose the operating performance of a PV string 14, as it is known that the shape of a power-voltage curve is dependent on characteristics of a particular PV string 14, such as shading issues, uneven temperature distribution, and/or other specific characteristics of individual PV strings, and thus can vary between PV strings (and between modules 16 on each string). FIG. 2 illustrates an example of power-voltage curves generated by an aging/degraded PV module and a new/healthy PV module, with the power-voltage curve for a healthy PV string (indicated as 30) and a degraded PV string (indicated as 32) being shown therein to illustrate that the power curve drops for the degraded PV string 14. FIG. 3 illustrates an example of power-voltage curves generated by a shaded PV module—such as might be caused by debris on the module—and a PV module having ideal irradiation, with the power-voltage curve for ideally irradiated PV string (indicated as 34) and the PV string with debris thereon (indicated as 36) being shown therein to illustrate that the power curve drops by a power loss 37 for the PV string 14 with debris thereon. It is recognized that FIGS. 2 and 3 are meant to only be provided as examples, and that the shape of the power-voltage curves can vary from that which is shown in the examples provided—with any deviation from the ideal curve being an indication that a PV module or associated connection/component may be operating improperly According to one embodiment of the invention, temperature sensors 38 can also be included in PV system 10 that measure the temperature of PV modules 16 during performance of the voltage sweep of the DC operating range of PV array 12. The temperature data acquired via temperature sensors 38 can be used in further analyzing the voltage and current data acquired is separate voltage sweeps that are performed in monitoring the condition of the PV array, as it is recognized that the temperature at which a voltage sweep is performed might vary as compared to the temperature at which prior or subsequent voltage sweeps were/will be performed. As it is known that variations in temperature can affect the level of DC voltage of PV modules 16, knowing the temperature at which a voltage sweep was performed will also assist in analyzing the voltage and current data acquired from the voltage sweep and provides for proper temperature compensation calculations to be included in the analysis of such data. Such temperature compensation, when combined with known irradiance conditions, allows for highly accurate diagnostics of PV array performance.

Figure 4:
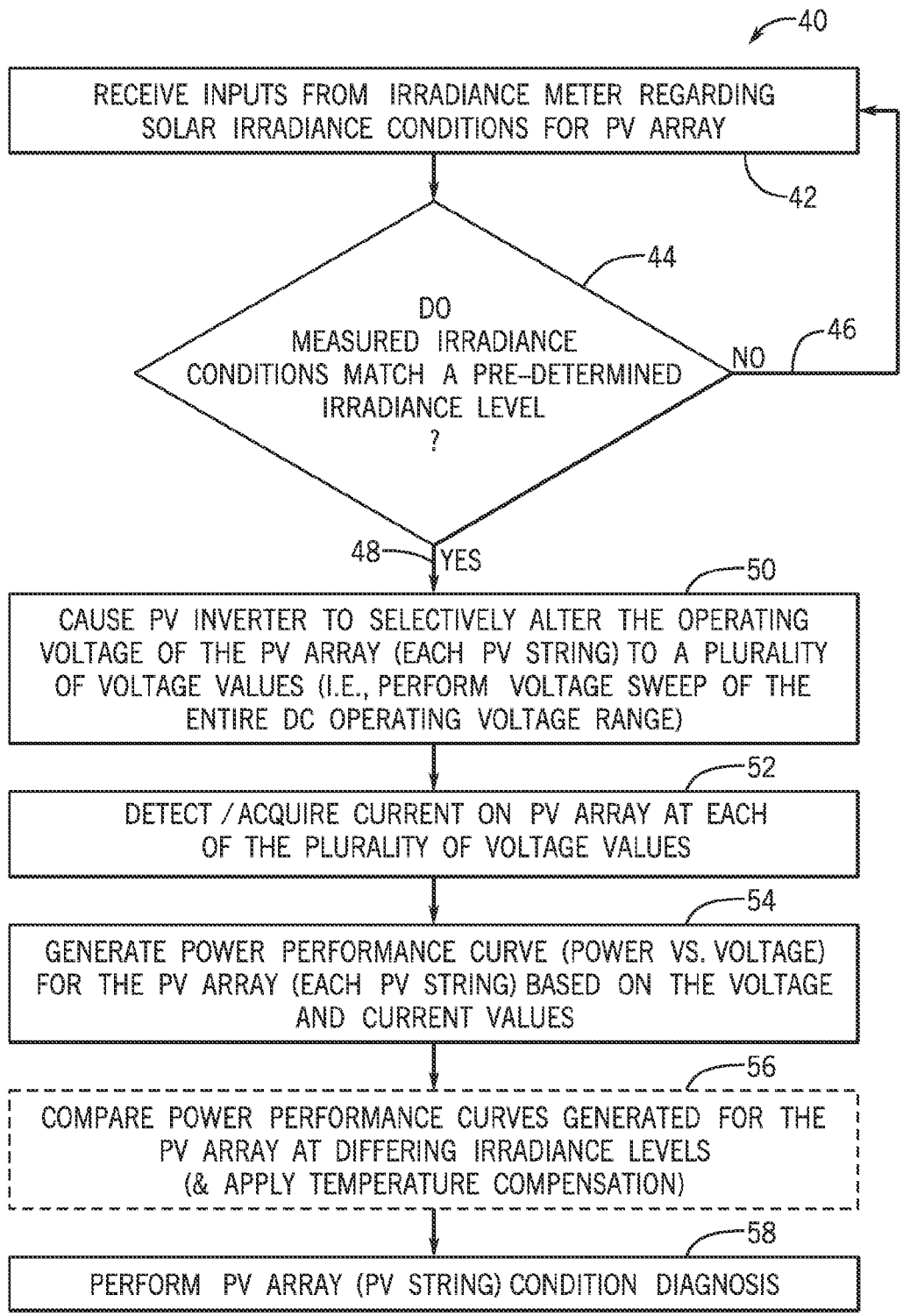
FIG. 4 is a flowchart illustrating a technique for monitoring the condition of the PV array in the PV system of FIG. 1 according to an embodiment of the invention

Referring now to FIG. 4, and with continued reference to FIG. 1, a flowchart illustrating a technique 40 for monitoring for PV string degradation is provided according to an embodiment of the invention. According to one embodiment, the technique 40 (or at least portions thereof) is implemented by controller 26 by execution of a diagnostic testing algorithm. The technique 40 begins at STEP 42, where the controller 26 receives inputs from the irradiance meter(s) 28 in the PV system 10 so as to monitor solar irradiance conditions for the PV array 12. At pre-determined time intervals, such as weekly, monthly, or quarterly, for example, the controller 26 will then cause a diagnostic testing of the PV array 12 to be performed. At such pre-determined times, a determination is first made at STEP 44 as to whether the current solar irradiance conditions are sufficient—i.e., whether the solar irradiance matches/meets a certain pre-determined level or value. In making such a determination, the input received by controller 26 from the irradiance meter 28 is analyzed to see if a current solar irradiance value matches a value at which it is desired to perform diagnostic testing. It is recognized that diagnostic testing may be desired at multiple irradiance values, and thus the current solar irradiance value may match one of a number of desired values.

If the current solar irradiance measured by irradiance meter 28 does not match/meet a desired pre-determined irradiance value, as indicated at 46, the technique loops back to STEP 42, where additional inputs are received at controller 26 from irradiance meter 28 and additional monitoring is performed until a time at which a desired irradiance value is present. Conversely, if the current solar irradiance measured by irradiance meter 28 matches/meets a desired pre-determined irradiance value, as indicated at 48, the technique continues by implementing/commencing a diagnostic testing routine via controller 26. In commencing the diagnostic testing, the technique 40 continues at STEP 50 where the controller 26 causes the inverter 22 to selectively alter the voltage of a respective PV string 14 or group of PV strings 14 to a number of different values. The voltage of PV strings 14 is altered to a number of distinct values such that a "voltage sweep" of the entire DC operating voltage range of the PV array 12 is performed.

In performing the voltage sweep of the DC operating voltage range of the PV array 12, the current level of the PV array—or of each PV string 14—is measured responsive to the altering of the voltage (i.e., at each of a number of distinct PV string voltages in the operating voltage range), as indicated at STEP 52, with a number of voltage and current pairs thus being acquired. Based on the acquired pairs of voltage and current obtained from the voltage sweep, a power vs. voltage performance curve is generated at STEP 54, with the curve detailing a relationship between the current and voltage for the PV array 12 or a respective PV string 14. The performance curve generated at STEP 54 is a full curve in that it is obtained from voltage and current values acquired across the entire DC operating voltage range of the PV array 12. This full performance curve generated by way of the voltage sweep is preferable to a partial performance curve that would typically be generated were voltage and current data to be collected during natural operating conditions.

According to an exemplary embodiment of the invention, a performance curve can be generated for the PV array (or for a PV string) for each of a number of different pre-determined solar irradiance levels. When multiple performance curve are generated for the PV array 12 for each of a number of different pre-determined solar irradiance levels, a comparison of the performance curves can be performed, as indicated in dashed lines at STEP 56, in order to provide further data on the condition of the PV array—as the performance curves can easily be compared and overlaid on/to one another since the irradiance level at which each curve was generated is known. In performing STEP 56, a temperature compensation can also be applied to account for any temperature variation that might be present when the voltage/current data was acquired for each curve, using data acquired from temperature sensors 38.

As the nature of the current-voltage relationship is indicative of a particular type of PV string degradation or performance issue, a PV string degradation detection and causal diagnosis can thus be performed at STEP 58 based on the nature of the current-voltage relationship. This degradation detection and casual diagnosis may be performed through human observation/analysis of the curves or sent to a central service for analyzing by an algorithm, for example, with the algorithm identifying degradation by data-mining current measurement with values lower than the average/typical current. For example, analysis of the curves (by human analysis or a remote recognition system) may determine that degradation of the PV array 12 has been caused by a soiling/debris problem, by several damaged cells in a PV module, module aging, or by some other identifiable or previously unknown factor, as any curve shape differing from the ideal curve will be recognized as "suspicious" behavior.

Beneficially, embodiments of the invention thus provide a system and method for implementing diagnostic testing in a PV power system in order to provide for detection of degradation of PV modules and strings therein and for identification of the cause and source of such PV degradation. Full power performance curves are collected regularly under defined irradiance (and temperature) conditions by causing the PV inverter to perform a voltage sweep of the of the entire DC operating voltage of the PV array 12, so as to enable quick identification of a solar array experiencing rapid age decline, debris on the solar modules, or any other previously known or not known factors affecting performance. Furthermore, as the voltage and current data is acquired under controlled and defined conditions, providing of benchmark settings and data calibration is easily achieved.

A technical contribution for the disclosed method and apparatus is that it provides for a controller implemented technique for controlling operation of a PV power system in order to enable diagnostic testing of PV array degradation, such that degradation of the array can be detected more accurately than was previously possible without separate or special equipment.

Therefore, according to one embodiment of the present invention, a PV system includes a PV array comprising a plurality of PV strings configured to generate a string output power responsive to received solar irradiation, a DC link connected to the plurality of PV strings such that the plurality of PV strings are connected to the DC link in a parallel arrangement, and a PV inverter electrically connected to the DC link to receive a DC output therefrom, the PV inverter configured to regulate the voltage of the plurality of PV strings. The PV system also includes an irradiance meter configured to measure a level of solar irradiance received by the PV array and a controller to control operation of the PV inverter for performing a diagnostic testing of the PV array, the controller being programmed to receive an input from the irradiance meter, the input comprising the measured level of solar irradiance received by the PV array, cause the PV inverter to alter the operating voltage of the PV array to each of a plurality of voltage values, detect current values in the PV array responsive to the altering of the voltage to each of the plurality of voltage values, and generate a power performance curve for the PV array based on the plurality of voltage values at which the PV array is operated and the detected current values, with the power performance curve being generated for the PV array at a known level of solar irradiance based on the received input from the irradiance meter.

According to another embodiment of present invention, a method for performing diagnostic testing on a PV array includes operating each of a plurality of parallel arranged PV strings in a PV array at a DC bus voltage determined by a PV inverter that is coupled to the plurality of PV strings by way of a DC bus, measuring a level of solar irradiance received by the plurality of PV strings, and selectively causing the PV inverter to alter an operating voltage of each of the plurality of PV strings to each of a plurality of voltage values, the plurality of voltage values spanning a entire DC operating voltage range of the PV strings. The method also includes detecting a current value in each of the plurality of PV strings for each of the respective plurality of voltage values to which the PV strings are altered and generating a power performance curve for each of the plurality of PV strings based on the plurality of voltage values at which the PV strings are operated and the respective detected current values, wherein the power performance curve generated for each of the plurality of PV strings is generated at a defined level of solar irradiance as known by the measured level of solar irradiance.

According to yet another embodiment of the present invention, a PV system includes a PV inverter, a DC link electrically coupled to the PV inverter and operating at a DC link voltage as determined by the PV inverter, and a PV array connected to the DC link and comprising a plurality of PM modules, the PV array configured to generate an output power responsive to received solar irradiation. The PV system also includes one or more irradiance meters connected to the PV array to measure a level of solar irradiance received thereby and a controller to control operation of the PV inverter for selectively performing a diagnostic testing of the PV array at each of a plurality of pre-determined irradiance conditions, the controller configured to selectively cause the PV inverter to sweep the DC operating voltage range of the PV array at each of one or more defined irradiance conditions, collect current data generated from the PV array responsive to the sweeping of the DC operating voltage range, and generate a power-voltage curve for the PV array at each of one or more defined irradiance conditions responsive to the sweeping of the DC operating voltage range of the PV array and the collected current data.

The present invention has been described in terms of the preferred embodiment, and it is recognized that equivalents, alternatives, and modifications, aside from those expressly stated, are possible and within the scope of the appending claims.

What is claimed is:

1. A photovoltaic (PV) system comprising:
   a PV array comprising a plurality of PV strings configured to generate a string output power responsive to received solar irradiation;
   a DC link connected to the plurality of PV strings such that the plurality of PV strings are connected to the DC link in a parallel arrangement;
   a PV inverter electrically connected to the DC link to receive a DC output therefrom, the PV inverter configured to regulate the voltage of the plurality of PV strings;
   an irradiance meter configured to measure a level of solar irradiance received by the PV array; and
   a controller to control operation of the PV inverter for performing a diagnostic testing of the PV array to identify component and connection degradation or failure in the PV system, the controller being programmed to:
      receive an input from the irradiance meter, the input comprising the measured level of solar irradiance received by the PV array;
      cause the PV inverter to alter the operating voltage of the PV array to each of a plurality of voltage values;
      detect current values in the PV array responsive to the altering of the voltage to each of the plurality of voltage values; and
      generate a power performance curve for the PV array based on the plurality of voltage values at which the PV array is operated and the detected current values, with the power performance curve being generated for the PV array at a known level of solar irradiance based on the received input from the irradiance meter;
      wherein the generated power performance curve is analyzable via human observation and analysis, or a remote pattern recognition system, to determine a cause of PV array degradation.

2. The PV system of claim 1 wherein, in causing the PV inverter to alter the operating voltage of the PV array, the controller is further programmed to cause the PV inverter to perform a voltage sweep across an entire DC operating voltage range of the PV array.

3. The PV system of claim 2 wherein the power performance curve comprises a full power performance curve generated from the voltage sweep across the entire DC operating voltage range of the PV array.

4. The PV system of claim 1 wherein the controller is further programmed to:
   cause the PV inverter to alter the operating voltage of each of the plurality of PV strings to each of a plurality of voltage values;
   detect current values in each of the plurality of PV strings responsive to the altering of the voltage to each of the plurality of voltage values; and
   generate a power performance curve for each of the plurality of PV strings based on the plurality of voltage values at which each of the plurality of PV strings are operated and the detected current values, with the power performance curve generated for each of the plurality of PV strings being at a known level of solar irradiance based on the received input from the irradiance meter.

5. The PV system of claim 4 wherein the generated power performance curve for each respective PV string is analyzable via human observation and analysis or a remote pattern recognition system to determine a cause of PV string degradation for each PV string.

6. The PV system of claim 1 wherein the controller is further programmed to:
   compare the measured level of solar irradiance to one or more pre-determined irradiance values at which it is desirable to perform the diagnostic testing of the PV array; and
   cause the PV inverter to alter the operating voltage of the PV array to each of the plurality of voltage values if the measured level of solar irradiance is at one of the pre-determined values.

7. The PV system of claim 6 wherein the controller is further programmed to generate a power performance curve for the PV array at each of the one or more pre-determined irradiance values.

8. The PV system of claim 7 wherein the controller is further programmed to compare power performance curves generated for the PV array at each of the one or more pre-determined irradiance values.

9. The PV system of claim 1 further comprising a temperature sensor configured to measure an operating temperature of the PV array;
   wherein the controller is further programmed to:
      receive an input from the temperature sensor, the input comprising the measured operating temperature of the PV array; and
      determine a temperature compensation to apply to the generated power performance curve based on the received input on the measured operating temperature of the PV array.

10. A method for performing diagnostic testing on a photovoltaic (PV) array, the method comprising:
    operating each of a plurality of parallel arranged PV strings in a PV array at a DC bus voltage, with the DC bus voltage being determined by a PV inverter that is coupled to the plurality of PV strings by way of a DC bus;
    measuring a level of solar irradiance received by the plurality of PV strings;
    selectively causing the PV inverter to alter an operating voltage of each of the plurality of PV strings to each of a plurality of voltage values, the plurality of voltage values spanning a entire DC operating voltage range of the PV strings;
    detecting a current value in each of the plurality of PV strings for each of the respective plurality of voltage values to which the PV strings are altered;
    generating a power performance curve for each of the plurality of PV strings based on the plurality of voltage values at which the PV strings are operated and the respective detected current values, the power performance curve generated for each of the plurality of PV strings being generated at a defined level of solar irradiance as known by the measured level of solar irradiance; and diagnosing an operating issue of a respective PV string based on an analysis of the power performance curve generated for the respective PV string at the defined level of solar irradiance.

11. The method of claim 10 further comprising:

comparing the measured level of solar irradiance to one or more pre-determined irradiance values at which it is desirable to perform the diagnostic testing of the PV array; and causing the PV inverter to alter the operating voltage of each of the plurality of PV strings to each of the plurality of voltage values, so as to initiate the diagnostic testing, if the measured level of solar irradiance is at one of the pre-determined values.

12. The method of claim 11 further comprising generating a power performance curve for each of the plurality of PV strings at each of the one or more pre-determined irradiance values.

13. The method of claim 12 further comprising, for each of the plurality of PV strings, comparing the power performance curves generated at each of the one or more pre-determined irradiance values.

14. The method of claim 12 further comprising:

measuring an operating temperature of a respective PV string; and determining a temperature correction to apply to each of the generated power performance curves for the PV string based on the measured operating temperature of the PV string.

15. A photovoltaic (PV) system comprising:

a PV inverter;

a DC link electrically coupled to the PV inverter and operating at a DC link voltage as determined by the PV inverter;

a PV array connected to the DC link and comprising a plurality of PM modules, the PV array configured to generate an output power responsive to received solar irradiation;

one or more irradiance meters connected to the PV array to measure a level of solar irradiance received thereby; and a controller to control operation of the PV inverter for selectively performing a diagnostic testing of the PV array at each of a plurality of pre-determined irradiance conditions to identify component and connection degradation or failure in the PV system, the controller configured to:

selectively cause the PV inverter to sweep the DC operating voltage range of the PV array at each of one or more defined irradiance conditions;

collect current data generated from the PV array responsive to the sweeping of the DC operating voltage range; and generate a power-voltage curve for the PV array at each of one or more defined irradiance conditions responsive to the sweeping of the DC operating voltage range of the PV array and the collected current data;

compare the power-voltage curves generated at each of the one or more defined irradiance conditions; and perform a diagnostic analysis of the PV array based on the comparison of the power-voltage curves generated at each of the one or more defined irradiance conditions;

wherein, in performing the diagnostic analysis, the controller is configured to identify any of a PV module shading, soiling or debris on a PV module, and PV module degradation or aging.

16. The PV system of claim 15 wherein the controller is configured to:

receive an input from the irradiance meter on the measured level of solar irradiance received by the PV array;

determine if the measured level of solar irradiance matches one of the plurality of pre-determined irradiance conditions; and cause the PV inverter to sweep the DC operating voltage range of the PV array if the measured level of solar irradiance matches one of the plurality of pre-determined irradiance conditions, so as to also collect current data for that irradiance condition and enable generation of a power-voltage curve.

* * * * *